(12) United States Patent
Gromoll et al.

(10) Patent No.: US 7,528,604 B2
(45) Date of Patent: May 5, 2009

(54) GRADIENT COIL SYSTEM AND MR IMAGING SYSTEM EMBODYING SAME

(75) Inventors: Bernd Gromoll, Baiersdorf (DE); Norbert Huber, Erlangen (DE); Johann Schuster, Oberasbach (DE); Lothar Schoen, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/834,099

(22) Filed: Aug. 6, 2007

(65) Prior Publication Data

US 2008/0030194 A1 Feb. 7, 2008

(30) Foreign Application Priority Data

Aug. 7, 2006 (DE) ........................ 10 2006 036 833

(51) Int. Cl.
*G01V 3/00* (2006.01)
(52) U.S. Cl. .................................................. 324/318
(58) Field of Classification Search .................. 324/318
See application file for complete search history.

(56) References Cited

U.S. PATENT DOCUMENTS

| 5,826,646 | A | * | 10/1998 | Bae et al. ..................... 165/110 |
| 6,111,412 | A | * | 8/2000 | Boemmel et al. ........... 324/318 |
| 6,642,717 | B2 | | 11/2003 | Dietz et al. |
| 7,154,270 | B2 | | 12/2006 | Arz et al. |

FOREIGN PATENT DOCUMENTS

DE          197 22 211          8/1998

* cited by examiner

*Primary Examiner*—Brij B. Shrivastav
*Assistant Examiner*—Megann E Vaughn
(74) *Attorney, Agent, or Firm*—Schiff Hardin LLP

(57) ABSTRACT

A gradient coil system for a magnetic resonance tomography apparatus has a layer structure including a gradient coil layer and a cooling layer. The cooling layer is fashioned as a plate heat exchanger, composed of plates, for cooling the gradient coil layer. In this way, a highly efficient cooling of the gradient coil layer is achieved with a lower structural height compared to conventional tubular configurations.

21 Claims, 6 Drawing Sheets

GRADIENT COIL SYSTEM AND MR IMAGING SYSTEM EMBODYING SAME

BACKGROUND OF THE INVENTION

1. Field of the Invention

The present invention relates to a gradient coil system, in particular for a magnetic resonance tomography apparatus, having a gradient coil layer and a layer structure that includes a cooling layer.

2. Description of the Prior Art

In the operation of a magnetic resonance tomography apparatus, for image production it is necessary to superimpose at least one gradient magnetic field on the magnetic basic field. This is done using a gradient coil system. Conventionally, the gradient coil system has a number of gradient coil layers having one or more gradient coils in order to produce three gradient magnetic fields perpendicular to one another. In the actively shielded gradient coil systems used today, in addition to the gradient coil layers that produce the useful field additional gradient coil layers are provided that externally shield the useful field. These additional gradient coil, layers are situated around the gradient coil layers that produce the useful field, at a distance from these layers.

Typically, a pulsed current on the order of magnitude of several hundred amperes flows through each gradient coil of the gradient coil layer. Due to the ohmic resistance of the gradient coils, a significant quantity of energy is converted into heat. This heat must be conveyed away in a suitable manner. In a magnetic resonance tomography apparatus for whole-body examinations, a good cooling of the gradient coils is particularly necessary because the patient is directly exposed to the heat produced by the gradient coil system.

Therefore, in a gradient coil system cooling layers are situated for conveying away the heat produced by the gradient coils of the gradient coil layers. The construction of such a cooling layer is described, for example, in DE 197 21 985 A1, and in WO 03/093853 A1.

For this purpose, one or more flexible cooling lines are situated on a gradient coil layer, so that the cooling lines essentially form a cooling layer between two layers of the gradient coil system.

The construction of such a gradient coil system is described in DE 100 32 836 C1. Additional details concerning the production of such a gradient coil system can be learned from DE 197 22 211 A1.

Here, the intermediate spaces between the individual gradient coil layers and the cooling layers are filled with a plastic matrix after the assembly of all the layers of the gradient coil system. In this way, the individual gradient coil layers and cooling layers are connected to form a unit. The plastic matrix, produced on the basis for example of an epoxy resin, has filling materials that have a high heat conductivity in order to achieve a good heat transfer from the gradient coil layer to the cooling lines of the cooling layer. In addition, the plastic matrix has elasticity, so that Lorentz forces that arise due to the very high currents between the individual gradient coils can be absorbed. In this way, at the same time the mechanical vibrations of the gradient coils during operation are damped, so that the production of noise by the gradient coil system during operation is relatively low.

Laying the cooling lines in a serpentine-like structure is very labor-intensive. In addition, the layers of the layer structure of the gradient coil system are usually concentrically situated hollow cylinders. The cooling lines thus must be situated on a curved surface. So that, before the casting with a plastic matrix, the cooling lines will remain in their serpentine-like structure, the individual cooling lines are sewed to the layer situated thereunder at various points. The sewing takes place using at least a plastic carrier onto which the gradient coils of the gradient coil layer situated thereunder are applied. This means an additional significant labor outlay. During the sewing, there is in addition the risk that a cooling line will be penetrated by a needle, and will thus develop a leak. This leak will normally not be recognized until a tightness test takes place after the manufacture of the gradient coil system has been completed. A single hole in a cooling line can make the entire gradient coil system unusable.

SUMMARY OF THE INVENTION

An object of the present invention is to provide a gradient coil system that can be manufactured as easily and economically as possible. In addition, the gradient coil system should have a cooling that is as efficient as possible. In addition, an object of the present invention is to provide an improved magnetic resonance tomography apparatus having such a gradient coil system.

The above object is achieved according to the present invention by a gradient coil system wherein the cooling layer is fashioned as a plate heat exchanger assembled from plates. The plates of the plate heat exchanger can be joined easily and economically. An expensive positioning of cooling lines in order to produce a cooling layer is eliminated. There is also no longer any risk that the cooling layer will be accidentally damaged during a fixing of the cooling layer, as can take place during sewing of the cooling lines.

The plate-type construction of the plate heat exchanger results in a full-surface contact between the cooling layer and the adjacent gradient coil layer. In this way, a very good heat transfer can be achieved. It is also possible to make the material of the plates porous.

The plates of the plate heat exchanger can be of a flexible construction. In particular if the individual layers of the gradient coil system are concentrically situated hollow cylinders, such a plate heat exchanger can be placed onto a gradient coil layer situated thereunder, and, due to its flexibility, can adapt to the surface of this gradient coil layer. In this way, a simple assembly of the plate heat exchanger is ensured. The flexible design means that there will be no mechanical damage to the plate heat exchanger.

The plate, or each of the plates, of the plate heat exchanger has material recesses for the formation of through-channels that are situated essentially parallel to the plane of the plates. Such recesses, for example, can be milled into the plate surface. The coolant fluid flows through these through-channels. An arrangement of a very large number of such channels next to one another offers the possibility of reducing the flow resistance in comparison with a design of the cooling layer using only a few cooling lines. A conveying device for the coolant must therefore overcome a lower flow resistance, and can therefore have a lower pumping power. In this way, not only are the manufacturing costs lower for this conveying device, but in particular the operating costs are also lower, because the current consumption is lower due to the lower pumping power.

In an embodiment, at least two plates are provided with further material openings fashioned in such a way that when the at least two plates are placed on top of one another, through openings result that are essentially perpendicular to the plane of the plates and that communicate with the through-channels. In this way, a good conducting away of heat can be achieved from both sides of the plates of the plate heat exchanger.

In an embodiment, these plates are situated between two terminating plates. Here the material openings in the plates can be formed such that the two terminating plates permit the formation of an essentially network-type channel structure that is essentially parallel to the plane of the plates. The terminating plates thus form the outwardly situated walls of the channels. In this way, the channel structure is formed solely by the through-openings in the plates. These openings can be made in the plates, for example, by stamping.

The cooling liquid flows through the plate heat exchanger essentially in the plane of the plates, but is conducted to both terminating plates in alternating fashion by the channels perpendicular to the plane of the plates. This not only creates a uniform heat transfer from both terminating plates to the coolant fluid but also the constant change of the direction of flow creates additional turbulences that further improve the heat transfer.

The material openings can have various shapes. Circular or oval openings are possible. In a preferred embodiment, the material recesses in the plates are Y-shaped, and, when at least two plates are stacked on one another, form a web-type channel structure. If the internal angle between two arms of the Y-shaped material openings is between 100° and 150°, a particularly effective flow through the produced channel structure can be achieved.

In another embodiment, the material openings in the plates are X-shaped, and form a diamond-shaped channel structure when at least two plates are stacked on one another.

Only a simple, economical stamping tool is required to make the X-shaped or Y-shaped material recesses.

Preferably, the limbs of the X-shaped or Y-shaped material recesses all have at least essentially the same length. In this way, a particularly regular web-shaped or diamond-shaped channel structure can be produced. Due to the plate thickness of the individual plates and the geometry of the material voids, the width of the individual channels and openings situated parallel and/or perpendicular to the plane of the plates can be determined within a broad range, and thus the amount of the heat transfer between the terminating plates and the coolant fluid can be set within a broad range.

In a further embodiment useful variant, the individual plates and terminating plates of the plate heat exchanger are fixedly connected to one another, in particular by gluing or welding. Gluing or welding offer an easy, economical production step. In this way, the plates are fixedly attached to one another in their desired positions.

Advantageously, the plates of the plate heat exchanger are made of a plastic, in particular a fabric or a thermoplastic, such as an epoxy resin. Such plastics are easily processable.

Preferably, the terminating plates are made of a material having a low thermal resistance. This is achieved by means of a small plate thickness and/or a good heat conductivity of the material. For example, a thin film of a thermoplastic is suitable. Because the terminating plates form the outer walls of the channels that pass through the plate heat exchanger, a particularly good heat transfer can be achieved from an adjacent gradient coil layer to the coolant liquid of the plate heat exchanger.

Preferably, the plates and the terminating plates have a structural height on the order of magnitude of one to 10 mm. In this way, a cooling layer can be produced having a structural height of only a few millimeters. Accordingly, the structural height is significantly less than that of a cooling layer made of cooling lines. It is therefore possible to accommodate a number of cooling layers in the gradient coil system without creating a larger structural height of the overall gradient coil system. It is even possible to individually cool each individual gradient coil layer using a plate heat exchanger without a resulting structural height that is greater than that of previously known conventional gradient coil systems. Thus, the individual gradient coils of the gradient coil layers can also be operated with an increased current strength, or pauses, previously standard, introduced during examinations in order to allow the heated gradient coil system to cool can be reduced or eliminated.

With the above-named gradient coil system, a structure that is more compact overall is also possible. Due to the smaller distance of the individual gradient coils from a person being examined, measurement with higher field strengths can take place.

Conventionally, the layers of the layer structure of the gradient coil system are either concentrically situated hollow cylinders or are placed one over the other in the manner of disks.

DESCRIPTION OF THE PREFERRED EMBODIMENTS

Figure 2:
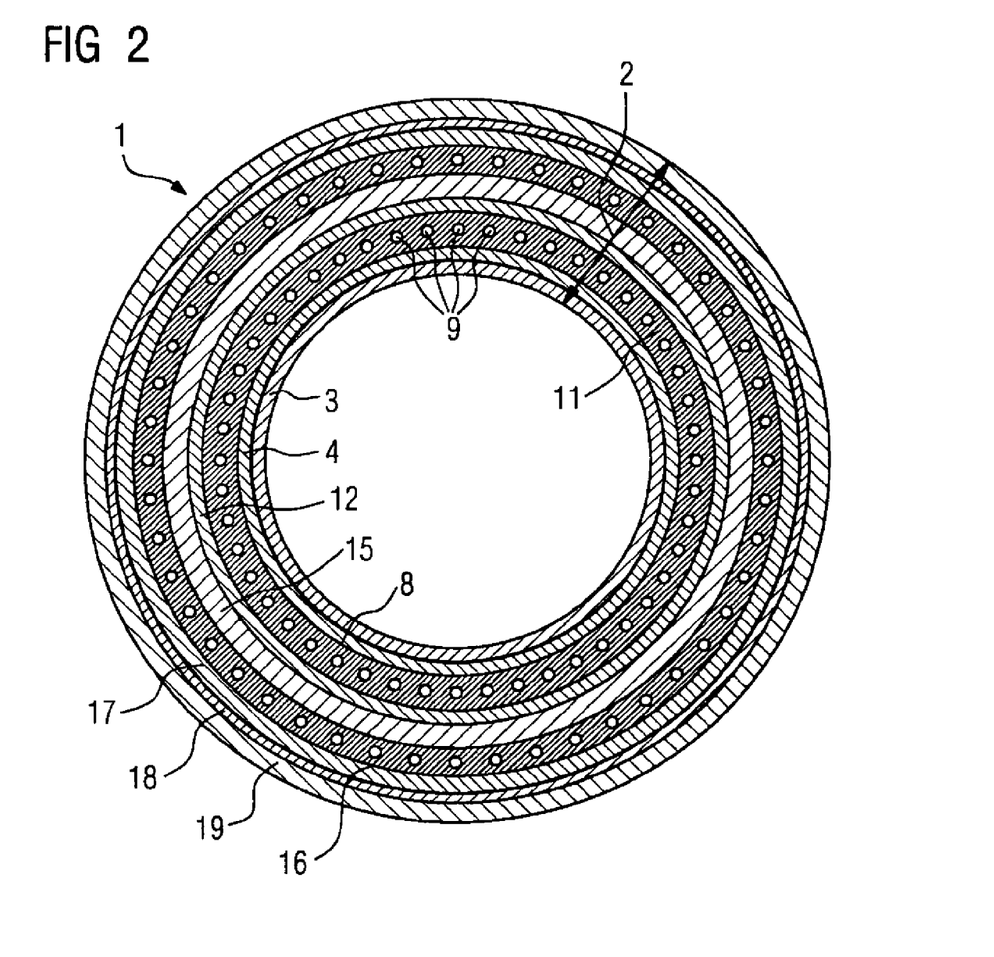
FIG. 2 schematically shows a gradient coil system according to the prior art in a cross-section perpendicular to the axial direction.

FIG. 2 shows a gradient coil system 1 according to the prior art. This gradient coil system 1 has a concentrically situated hollow cylindrical layer structure 2. The assembly of the individual layers of the layer structure takes place from the inside to the outside in the radial direction. The first hollow cylindrical layer is assembled to the jacket surface of a cylindrical assembly aid. The second layer is assembled to the outer jacket surface of the first layer, etc.

The innermost two layers are a first gradient coil layer 3 and a second gradient coil layer 4, for producing a respective transverse gradient magnetic field. The gradient coils built into these two gradient coil layers are saddle coils.

A first cooling layer 8 is connected thereto as the next layer. This layer is composed of cooling lines 9 arranged in a serpentine path around the outer jacket surface of second gradient coil layer 4, in order to conduct away the heat generated by the gradient coil layers. These cooling lines 9 are fixed by sewing to a plastic carrier on which the gradient coils of second gradient coil layer 4 are situated.

The cooling lines are embedded in a plastic matrix 11. Part of the plastic matrix 11 is formed by filling materials that are not shown in the drawing and that improve the heat conductivity of the plastic matrix.

To first cooling layer 8 there is connected a third gradient coil layer 12 for producing a longitudinal gradient magnetic field. This third gradient coil layer 12 contains axially situated gradient coils. As the next layer, there follows what is called a shim module 15. This shim module has pocket-like hollow spaces (not shown in FIG. 2), situated in the axial direction of the gradient coil system, for receiving shim elements (also not shown in the drawing), which are essentially metal strips. These shim elements permit the formation and homogenization of the static basic or main magnetic field.

To the shim module 15, there is connected an additional second cooling layer 16, in which the cooling lines 9 are situated and fixed on the layer situated thereunder in the manner already described. In the radial direction, seen outwardly, to this second cooling layer 16 there is connected a fourth gradient coil layer 17 for producing a longitudinal gradient magnetic field, as well as a fifth gradient coil layer 18 and a sixth gradient coil layer 19 for producing two transverse gradient magnetic fields. These external gradient coil layers 17, 18, 19 have the same design as inner gradient coil layers 3, 4, 12, but they are designed so that they shield stray fields outside the gradient coil system. In this way, it is ensured that the gradient magnetic field prevails only inside the gradient coil system.

After the assembly of all layers of the gradient coil system, the intermediate spaces are cast with a plastic, for example an epoxy resin or polyurethane, so that in particular the plastic matrix that surrounds cooling lines 9 is formed.

The first cooling layer 8 and the second cooling layer 16 are used to cool the total of six gradient coil layers 3, 4, 12, 17, 18, 19. The heat generated by gradient coil layers 3, 4, 12, 17, 18, 19 is absorbed by plastic matrix 11, is transferred to the coolant liquid flowing through cooling lines 9, and is transported away by this liquid. As a coolant liquid, a water-based or oil-based liquid is used.

Figure 1:
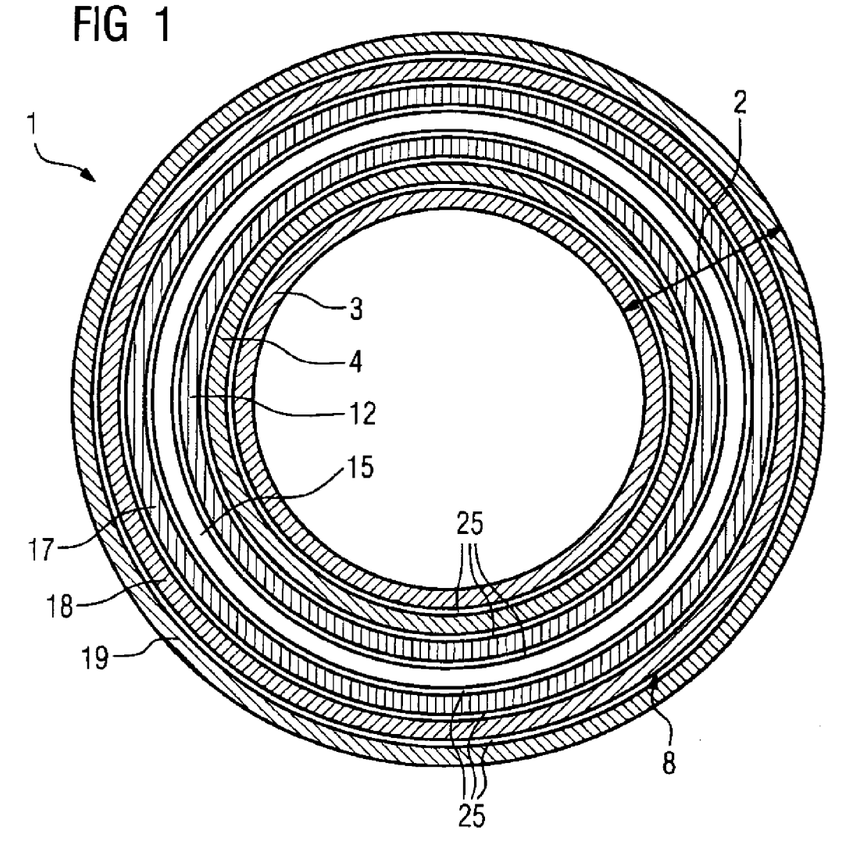
FIG. 1 shows, also schematically, a gradient coil system in a cross-section perpendicular to the axial direction.

FIG. 1 shows a gradient coil system 1 having plate heat exchangers 25 as the cooling layers 8 in accordance with the invention. As in FIG. 2, the individual gradient coil layers are concentrically situated hollow cylinders.

As in FIG. 2, three gradient coil layers 3, 4, and 12 are situated radially from inside to outside. There subsequently follows a shim module 15. To this shim module 15 there are connected, as in FIG. 2, three additional gradient coil layers 17, 18, and 19.

Between each two adjacent gradient coil layers, e.g., between the first gradient coil layer 3 and the second gradient coil layer 4, and between each gradient coil layer 3, 4, 12, 17, 18, 19 and the shim module 15, there is situated a respective plate heat exchanger 25 as cooling layer 8. This plate heat exchanger 25 has a significantly lower structural height than does the respective cooling layers 8, 16 in FIG. 2. The plate heat exchangers 25, like the two cooling layers 8 and 16, conduct away the heat generated by gradient coil layers 3, 4, 12, 17, 18, 19. Because the structural height of a single cooling layer 8 in FIG. 1 is smaller than in FIG. 2, such a cooling layer 8 in the form of a plate heat exchanger 25 can be situated between each two adjacent layers of gradient coil system 1 without increasing the structural height of the overall gradient coil system 1 in the radial direction. Thus, with a comparable structural height a greatly improved and homogenized conducting away of the heat produced by gradient coil layers 3, 4, 12, 17, 18, 19 can be achieved. The structure of the individual plate heat exchangers 25 is explained in detail in FIGS. 3 and 4.

Figure 3:
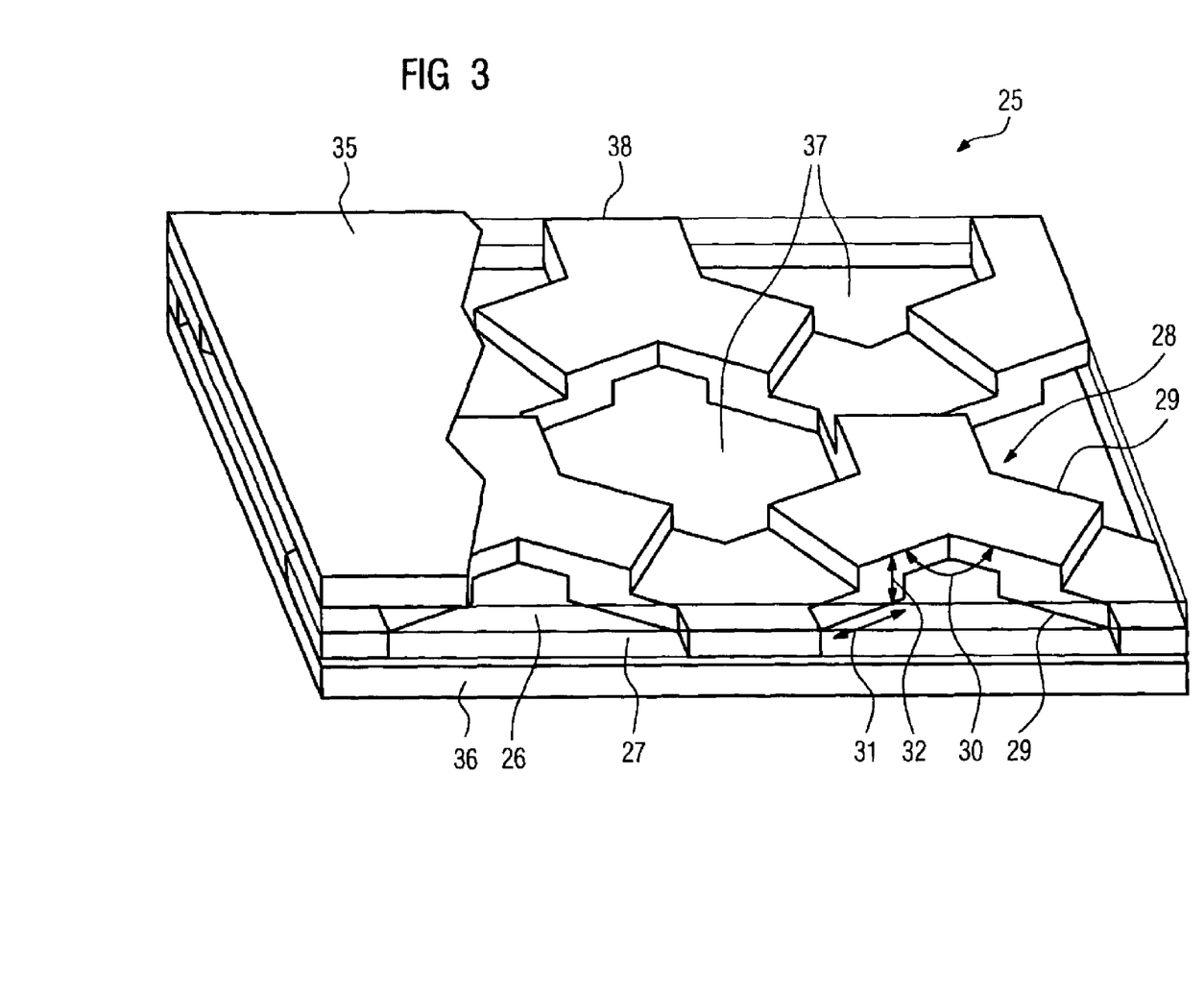
FIG. 3 shows a detail of an embodiment of a plate heat exchanger having Y-shaped recesses.

FIG. 3 shows a detail of a plate heat exchanger 25. The plate heat exchanger 25 has an upper plate 26 and a lower plate 27. In both plates, Y-shaped material recesses 28 are stamped out at a distance from one another. Y-shaped material recesses 28 each have three equally long limbs 29, each pair of limbs forming a 120° angle 30. The two plates 26, 27 are placed on one another in such a way that the Y-shaped material recesses of lower plate 27 are rotated by 180° relative to the material recesses 28 of the upper plate 26. By a suitable dimensioning in particular of the length of limbs 29 of material recesses 28, when the plates are placed on one another overlap points 31 result between the arms 29 of the Y-shaped material openings 28 of the upper plate 26 and those of the lower plate 27. These overlap points 31 form through-channels 32 perpendicular to the plane of the plates 26 and 27.

The upper plate 26 and the lower plate 27 are glued to one another along their surfaces. Moreover, an upper terminating plate 35 is glued onto the upper plate 26, and a lower terminating plate 36 is glued onto the lower plate 27. The upper terminating plate 35 and the lower terminating plate 36 are supported at support points 37. A support point 37 means a flat plate segment at which both the upper plate 26 and the lower plate 27 have no material opening 28, and which is accordingly made of solid material.

The upper terminating plate 35 and the lower terminating plate 36 form the outer walls of all the through-channels formed by all four plates 26, 27, 35, 36 and situated parallel to the plane of the plates.

Figure 6:
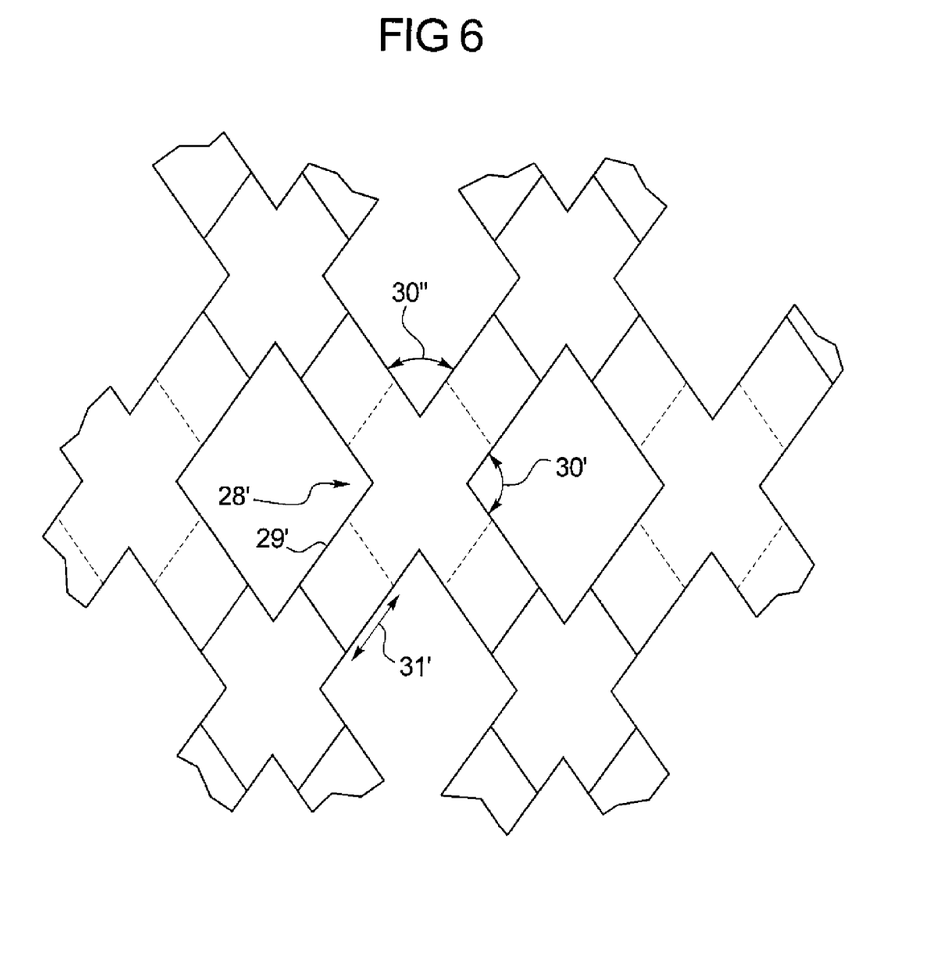
FIG. 6 shows a detail of an embodiment of a plate heat exchanger having X-shaped recesses.

FIG. 6 shows a detail of a further embodiment wherein the recesses 28' are X-shaped, with the respective arms of each X-ray shaped recess 28' forming angels 30' or 30" with respect to each other. Again, the recesses have respective overlap points 31' that result in the formation of three-channels perpendicular to the plane of the plate or plates.

Figure 4:
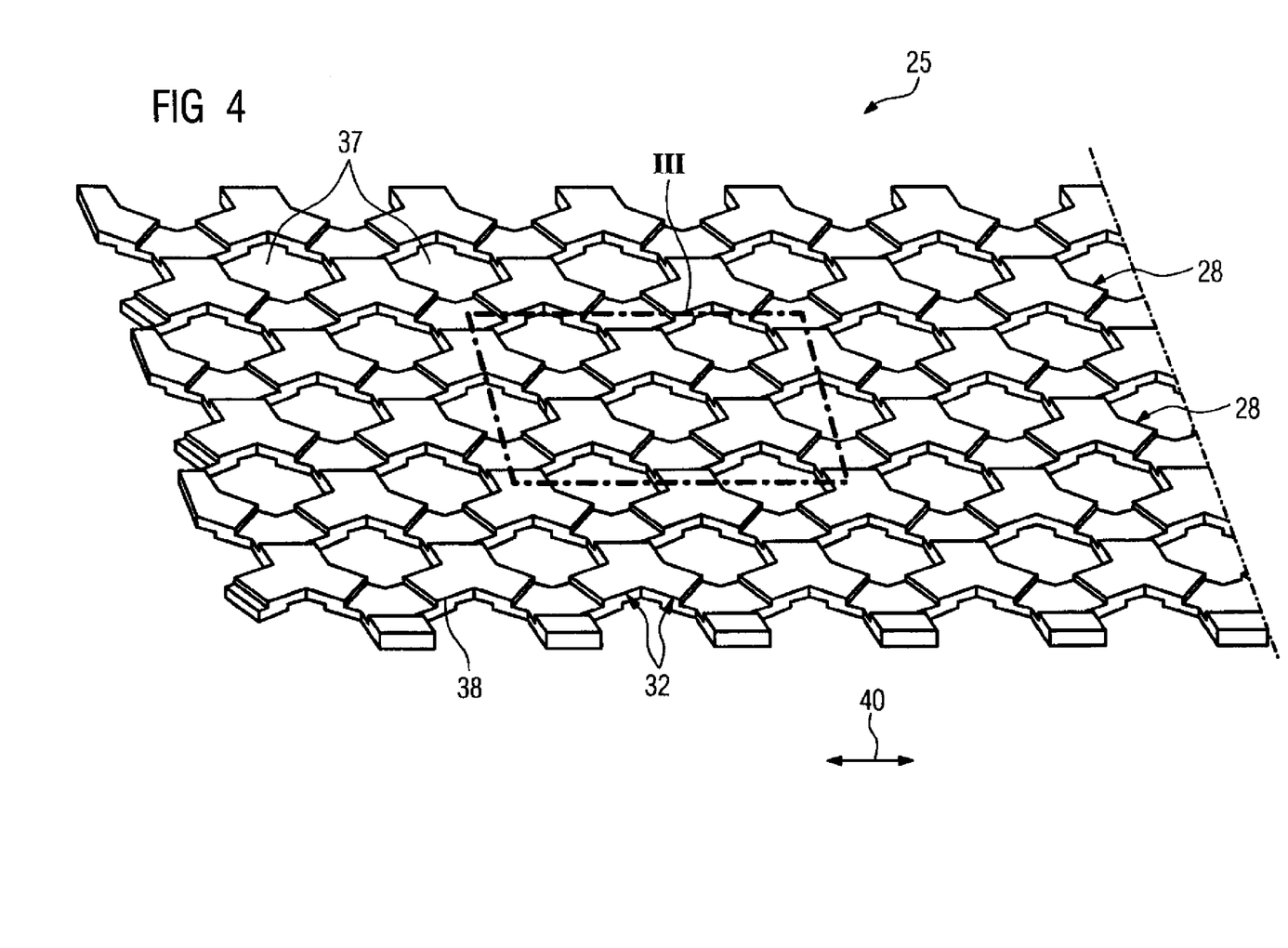
FIG. 4 shows a larger detail of the plate heat exchanger.

FIG. 4 shows a larger segment of a plate heat exchanger 25. Through-channels 38, situated essentially parallel to the plane of the plates, yield an overall web-shaped channel structure. Through-channels 32, running essentially perpendicular to the plane of the plates, ensure that the coolant fluid flowing through the channel structure comes into contact with the walls of both terminating plates 35 and 36. Due to the constant change of the direction of flow, there results an additional improvement of the heat transfer. If, as a material for upper terminating plate 35 and lower terminating plate 36, a material is chosen having high heat conductivity, such as a metallic flat sheet, a very good heat transfer can be achieved through the surface contact to an adjacent gradient coil layer 3, 4, 12, 17, 18, 19.

As a material for the two plates 26 and 27, a relatively soft thermoplastic is used. Overall, plate heat exchanger 25 is flexible enough that it can be adapted to the outer covering of the hollow cylindrical layer, situated thereunder, of gradient coil system 1.

The plate heat exchanger 25 here covers the entire jacket surface of the layer situated thereunder. Subsequently, the next layer of gradient coil system 1 is fastened onto the external jacket surface of plate heat exchanger 25.

On both end surfaces of hollow cylindrical gradient coil system 1, for each plate heat exchanger 25 there are situated devices (not shown in FIG. 4) of the type forming a collector receptacle (manifold) that are charged with or that carry away the coolant liquid. The coolant medium flows through plate heat exchanger 25 in the axial direction 40, relative to gradient coil system 1, and provides a uniform conducting away of the heat generated by adjacent gradient coil layers 3, 4, 12, 17, 18, 19. Alternatively, it is also possible for the medium to flow through plate heat exchanger 25 in the radial direction.

Figure 5:
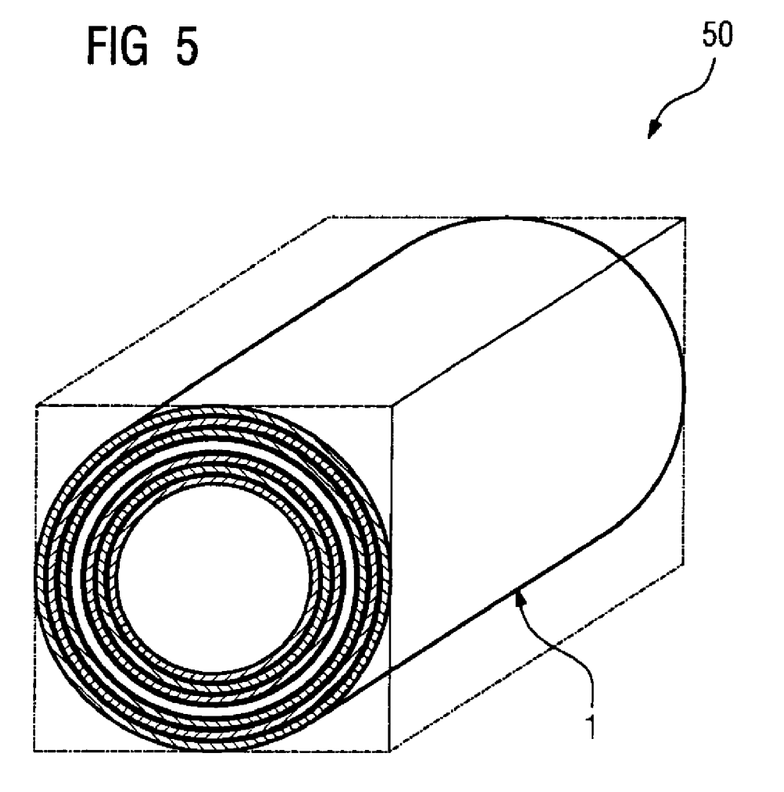
FIG. 5 schematically shows a magnetic resonance tomography apparatus.

FIG. 5 schematically shows a magnetic resonance tomography apparatus 50 having a gradient coil system 1 according to FIG. 1.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient coil system for a magnetic resonance tomography apparatus comprising:

a layer structure comprising a gradient coil layer and a cooling layer;

said cooling layer comprising a plate heat exchanger comprised of a plurality of plates, respectively in plate planes, in thermally conducting relation with said gradient coil layer for cooling said gradient coil layer; and at least one plate in said plurality of plates having material recesses in each of opposite sides thereof parallel to said plate planes, the respective material recesses in said opposite sides being situated relative to each other to cause said through-channels to communicate with each other to form a through opening proceeding through said at least one of said plates perpendicular to said plate planes.

2. A gradient coil system as claimed in claim 1 wherein said gradient coil layer, said cooling layer and said plates of said heat exchanger are flexible, making an entirety of said layer structure flexible.

3. A gradient coil system as claimed in claim 1 wherein said plurality of plates includes two adjacent plates each having said plate recesses therein, said two adjacent plates being disposed relative to each other in said plate heat exchanger to cause the respective through-channels in said two adjacent plates to be substantially in registration with each other.

4. A gradient coil system as claimed in claim 3 wherein said plate recesses in each of said two adjacent plates are Y-shaped, with the respective plate openings in said two adjacent plates, in combination, forming a web-shaped channel structure.

5. A gradient coil system as claimed in claim 4 wherein each of said Y-shaped recesses has three arms, with an internal angle between any two of said arms being in a range between 100° and 150°.

6. A gradient coil system as claimed in claim 5 wherein said arms of said Y-shaped recesses are substantially equal in length.

7. A gradient coil system as claimed in claim 3 wherein said recesses in said two adjacent plates are X-shaped, and wherein said X-shaped openings in said two adjacent plates, in combination, form a diamond-shaped channel structure.

8. A gradient coil system as claimed in claim 7 wherein each X-shaped recess has four arms of substantially equal length.

9. A magnetic resonance tomography apparatus as claimed in claim 8 wherein each of said plates in said plurality of plates forming said plate heat exchanger has a structural height in a range between 1 mm and 10 mm.

10. A gradient coil system as claimed in claim 1 comprising two terminating plates, respectively on opposite sides of said at least one plate having said through-channels therein, each of said terminating plates having no through-channels therein.

11. A gradient coil system as claimed in claim 10 wherein each of said terminating plates is comprised of a material having a low thermal resistance.

12. A gradient coil system as claimed in claim 11 wherein each of said plates, other than said terminating plates, is comprised of a plastic.

13. A gradient coil system as claimed in claim 12 wherein said plastic is selected from the group consisting of solid fabrics and thermoplastics.

14. A gradient coil system as claimed in claim 1 wherein said plurality of plates forming said plate heat exchanger are fixedly connected to each other.

15. A gradient coil system as claimed in claim 14 wherein said plurality of plates in said heat exchanger are fixedly connected to each other by a fixing technique selected from the group consisting of gluing and welding.

16. A gradient coil system as claimed in claim 1 wherein each of said plurality of plates forming said heat exchanger has a structural height in a range between 1 mm and 10 mm.

17. A gradient coil system as claimed in claim 1 wherein each of said gradient coil layer and said cooling layer is flexible, and wherein said gradient coil layer and said cooling layer are each formed as a hollow cylinder, the respective hollow cylinders being concentric.

18. A gradient coil system as claimed in claim 1 wherein each of said gradient coil layer and said cooling layer is formed as a disk, with the respective disks being disposed adjacent to each other.

19. A gradient coil system as claimed in claim 1 wherein said one of said plates additionally has material voids therein proceeding completely through said one of said plates perpendicular to said plate planes, said material voids communicating with said through-channels.

20. A magnetic resonance tomography apparatus comprising:

a magnetic resonance scanner configured to interact with an examination subject to acquire magnetic resonance data from the subject;

a gradient coil system structurally built into said magnetic resonance scanner;

said gradient coil system comprising a layer structure comprising a gradient coil layer and a cooling layer, said cooling layer comprising a plate heat exchanger comprised of a plurality of plates, respectively in plate planes, in thermally conducting relation with said gradient coil layer for cooling said gradient coil layer; and at least one plate in said plurality of plates having material recesses in each of opposite sides thereof parallel to said plate planes, the respective material recesses in said opposite sides being situated relative to each other to cause said through-channels to communicate with each other to form a through opening proceeding through said at least one of said plates perpendicular to said plate planes.

21. A magnetic resonance tomography apparatus as claimed in claim 20 wherein said one of said plates additionally has material voids therein proceeding completely through said one of said plates perpendicular to said plate planes, said material voids communicating with said through-channels.

* * * * *